(12) United States Patent
Sugiya

(10) Patent No.: US 10,825,678 B2
(45) Date of Patent: Nov. 3, 2020

(54) WAFER PROCESSING METHOD

(71) Applicant: DISCO CORPORATION, Tokyo (JP)

(72) Inventor: Tetsukazu Sugiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/582,146

(22) Filed: Sep. 25, 2019

(65) Prior Publication Data

US 2020/0111658 A1 Apr. 9, 2020

(30) Foreign Application Priority Data

Oct. 3, 2018 (JP) .................................. 2018-188267

(51) Int. Cl.
| | | |
|---|---|---|
| *H01L 21/02* | (2006.01) | |
| *H01L 21/18* | (2006.01) | |
| *H01L 21/304* | (2006.01) | |
| *H01L 21/768* | (2006.01) | |
| *H01L 21/683* | (2006.01) | |

(52) U.S. Cl.
CPC .. *H01L 21/02013* (2013.01); *H01L 21/02675* (2013.01); *H01L 21/187* (2013.01); *H01L 21/304* (2013.01); *H01L 21/3043* (2013.01); *H01L 21/6835* (2013.01); *H01L 21/6836* (2013.01); *H01L 21/76894* (2013.01)

(58) Field of Classification Search
CPC ............... H01L 21/304; H01L 21/6835; H01L 21/6836; H01L 21/76894; H01L 2221/68327; H01L 21/02013; H01L 21/187; H01L 21/02675; H01L 21/3043
USPC ......................................... 216/33, 36, 88, 94
See application file for complete search history.

(56) References Cited

U.S. PATENT DOCUMENTS

2014/0305916 A1* 10/2014 Wei ................... H01L 21/67092
  219/121.64
2020/0027773 A1* 1/2020 Lin ........................ B28D 5/022

FOREIGN PATENT DOCUMENTS

JP 2007158239 A 6/2007

* cited by examiner

*Primary Examiner* — Binh X Tran
(74) *Attorney, Agent, or Firm* — Greer Burns & Crain, Ltd.

(57) ABSTRACT

A wafer processing method includes: a bonding step of bonding a front surface side of a first wafer chamfered at a peripheral edge portion thereof to a front surface side of a second wafer; a grinding step of holding a back surface side of the second wafer by a chuck table and grinding a back surface of the first wafer to thin the first wafer to a finished thickness, after the bonding step; and a modified layer forming step of applying along a boundary between a device region and a peripheral surplus region of the first wafer a laser beam of such a wavelength as to be transmitted through the first wafer to form an annular modified layer inside the first wafer in the vicinity of the front surface of the first wafer, before the grinding step.

10 Claims, 17 Drawing Sheets

WAFER PROCESSING METHOD

BACKGROUND OF THE INVENTION

Field of the Invention

The present invention relates to a processing method for a bonded wafer.

Description of the Related Art

In chips obtained by dicing a through-silicon via (TSV) wafer, through-electrodes enable connection of electrodes of two chips by bonding the two chips on each other. For example, three dimensional Not AND (3D NAND) flash memories and the like are manufactured by this technology. A TSV wafer is ground and thinned for obtaining a lower back surface, and, in this case, the TSV wafer is ground in the state of being bonded on a support wafer (formed of silicon, glass, ceramic or the like) serving as a base.

Usually, a peripheral side surface of a wafer is chamfered to be round in shape; therefore, when the wafer is ground to be extremely thin, the periphery of the wafer becomes what is generally called a knife edge, and chipping of the edge is liable to occur during grinding. When chipping of the edge occurs during grinding, the chipping may extend to devices, leading to breakage of the devices. As a countermeasure against this problem, what is generally called an edge trimming technology has been developed (see, for example, Japanese Patent No. 4895594).

SUMMARY OF THE INVENTION

However, the edge trimming technology disclosed in Japanese Patent No. 4895594 has had a problem that, in cutting a peripheral edge on the front surface side of a wafer in an annular form, chipping that reaches devices actually occurs, leading to breakage of the devices, or a large amount of swarf is generated, leading to easy contamination of the devices.

Accordingly, it is an object of the present invention to provide a wafer processing method by which breakage of devices during grinding can be restrained.

In accordance with an aspect of the present invention, there is provided a wafer processing method including: a bonding step of bonding a front surface side of a first wafer chamfered at a peripheral edge portion thereof to a front surface side of a second wafer, the first wafer having on the front surface thereof a device region formed with a plurality of devices and a peripheral surplus region surrounding the device region; a grinding step of holding a back surface side of the second wafer by a chuck table and grinding a back surface of the first wafer to thin the first wafer to a finished thickness, after the bonding step is performed; and a modified layer forming step of applying along a boundary between the device region and the peripheral surplus region of the first wafer a laser beam of such a wavelength as to be transmitted through the first wafer, to form an annular modified layer inside the first wafer in the vicinity of the front surface side thereof, before the grinding step is performed, in which chipping of a peripheral edge of the first wafer occurring in the grinding step is restrained from extending into the device region by the annular modified layer.

Preferably, in the modified layer forming step in the wafer processing method, the modified layer is formed by the laser beam applied from the back surface side of the first wafer, before or after the bonding step.

Preferably, in the modified layer forming step in the wafer processing method, the modified layer is formed by the laser beam applied from the front surface side of the first wafer, before the bonding step.

In accordance with another aspect of the present invention, there is provided a wafer processing method including: a bonding step of bonding a front surface side of a first wafer chamfered at a peripheral edge portion thereof to a front surface side of a second wafer, the first wafer having on the front surface thereof a device region formed with a plurality of devices and a peripheral surplus region surrounding the device region; a grinding step of holding a back surface side of the second wafer by a chuck table and grinding a back surface of the first wafer to thin the first wafer, after the bonding step is performed; and a laser-processed groove forming step of applying from the front surface side of the first wafer along a boundary between the device region and the peripheral surplus region a laser beam of such a wavelength as to be absorbed in the first wafer, to form an annular laser-processed groove having a depth exceeding a finished thickness of the first wafer on the front surface of the first wafer, before the bonding step is performed.

The wafer processing method of the present invention has an effect that breakage of devices during grinding can be restrained.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
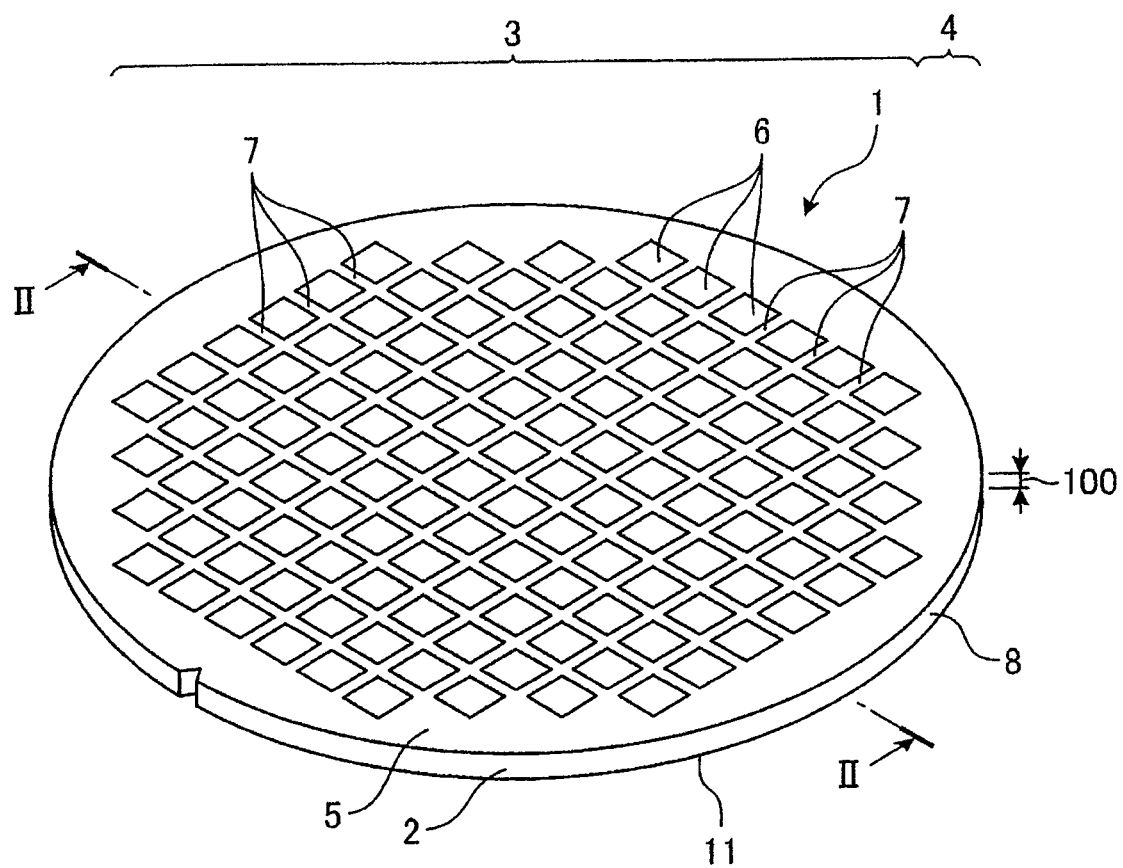
FIG. 1 is a perspective view depicting an example of a wafer as an object to be processed by a wafer processing method according to a first embodiment.

Embodiments of the present invention will be described in detail below referring to the drawings. The present invention is not to be limited by the contents of the following description of the embodiments. In addition, the constituent elements described below include those that are easily conceivable by a person skilled in the art and those that are substantially the same. Further, the configurations described below may be combined as required. Besides, various omissions, replacements and modifications of the configurations may be performed within such a range as not to depart from the gist of the present invention.

First Embodiment

Figure 2:
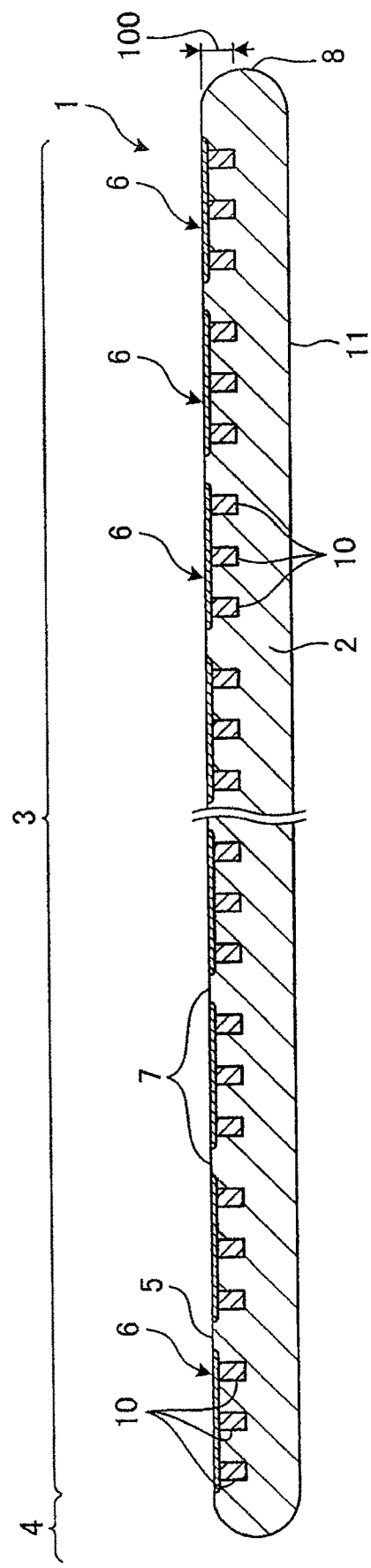
FIG. 2 is a sectional view taken along line II-II of FIG. 1.
Figure 3:
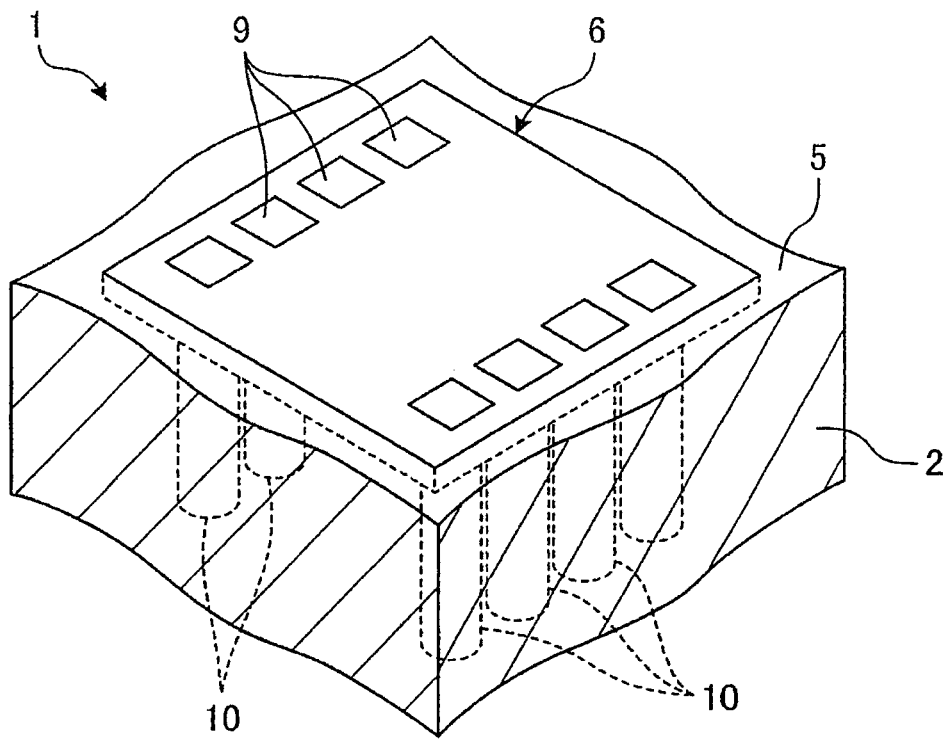
FIG. 3 is a perspective view depicting, in an enlarged form, a device of the wafer illustrated in FIG. 1.
Figure 4:
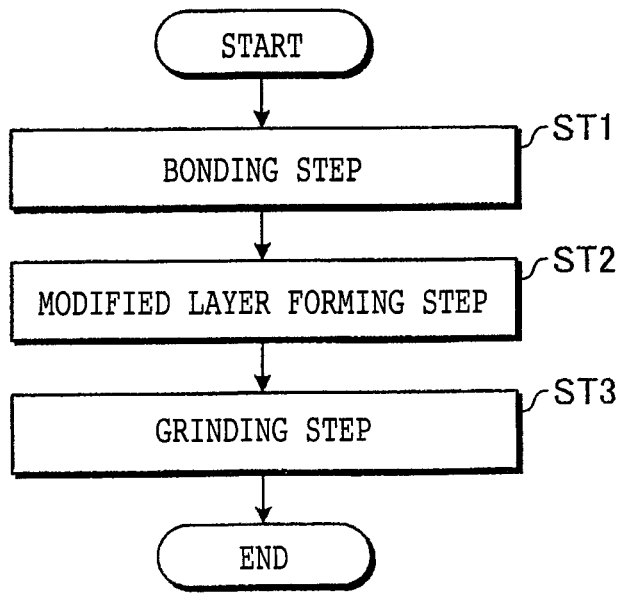
FIG. 4 is a flow chart depicting the flow of the wafer processing method according to the first embodiment.

A wafer processing method according to the first embodiment of the present invention will be described based on the drawings. FIG. 1 is a perspective view illustrating an example of a wafer as an object to be processed by the wafer processing method according to the first embodiment. FIG. 2 is a sectional view taken along line II-II of FIG. 1. FIG. 3 is a perspective view illustrating, in an enlarged form, a device of the wafer depicted in FIG. 1. FIG. 4 is a flow chart depicting the flow of the wafer processing method according to the first embodiment.

The wafer processing method according to the first embodiment is a processing method for a wafer 1 illustrated in FIG. 1. In the first embodiment, the wafer 1 is a disk-shaped semiconductor wafer or optical device wafer with a substrate 2 formed from silicon, sapphire, gallium-arsenide or the like. As depicted in FIGS. 1 and 2, the wafer 1 has on a front surface 5 side of the substrate 2 a device region 3 and a peripheral surplus region 4 surrounding the device region 3, and is chamfered at a peripheral edge 8 thereof.

The device region 3 is formed with a plurality of devices 6, which are formed respectively in regions partitioned by a plurality of crossing division lines 7 on the front surface 5 of the substrate 2. In other words, the crossing division lines 7 partition the plurality of devices 6 from one another. In the first embodiment, the device 6 is one constituting a 3D NAND flash memory, but in the present invention, this is not limitative.

In addition, as illustrated in FIG. 3, the device 6 is provided with electrode pads 9, and through-electrodes 10 connected to the electrode pads 9. At least one electrode pad 9 (in the first embodiment, a plurality of electrode pads 9) is provided at the front surface of the device 6. The through-electrode 10 becomes a through-silicon via (TSV) that penetrates the substrate 2 of the device 6 when the substrate 2 is thinned and the devices 6 are individually divided from the wafer 1. In the first embodiment, the through-electrodes 10 are provided in one-to-one correspondence with the electrode pads 9. The through-electrode 10 has one end connected to the corresponding electrode pad 9, extends from the corresponding electrode pad 9 toward a back surface 11 of the substrate 2 of the wafer 1, and is embedded in the substrate 2. Note that the length of the through-electrode 10 from the front surface 5 of the substrate 2 of the wafer 1 is equal to a finished thickness 100 of the wafer 1, but, in the present invention, it may be greater than the finished thickness 100.

Note that in a state before performing processing by the wafer processing method according to the first embodiment, the through-electrode 10 has its other end not exposed to the back surface 11 side but located in the substrate 2, as illustrated in FIGS. 2 and 3. In the first embodiment, the wafer 1, in which the devices 6 have the through-electrodes 10 described above, is what is generally called a TSV wafer in which the individually divided devices 6 each have the TSVs.

The peripheral surplus region 4 is a region which surrounds the device region 3 along the whole circumference of the latter and in which the devices 6 are not formed. In addition, the peripheral edge 8 of the wafer 1 is formed to have an arcuate sectional shape from the front surface 5 to the back surface 11, such that the center in the thickness direction projects to the outermost periphery side.

The wafer processing method according to the first embodiment is a method in which the front surface 5 sides of a pair of wafer 1 are bonded to each other, and the wafer 1 on one side is thinned to the finished thickness 100. Note that when the wafers 1 of the pair of wafers 1 are distinguished from each other, herein, the wafer 1 on one side is referred to as a first wafer 1-1, and the wafer 1 on the other side is referred to as a second wafer 1-2; when the wafers 1 are not distinguished from each other, the wafer 1 is simply referred to as wafer 1. As depicted in FIG. 4, the wafer processing method according to the first embodiment includes a bonding step ST1, a modified layer forming step ST2, and a grinding step ST3.

(Bonding Step)

Figure 5:
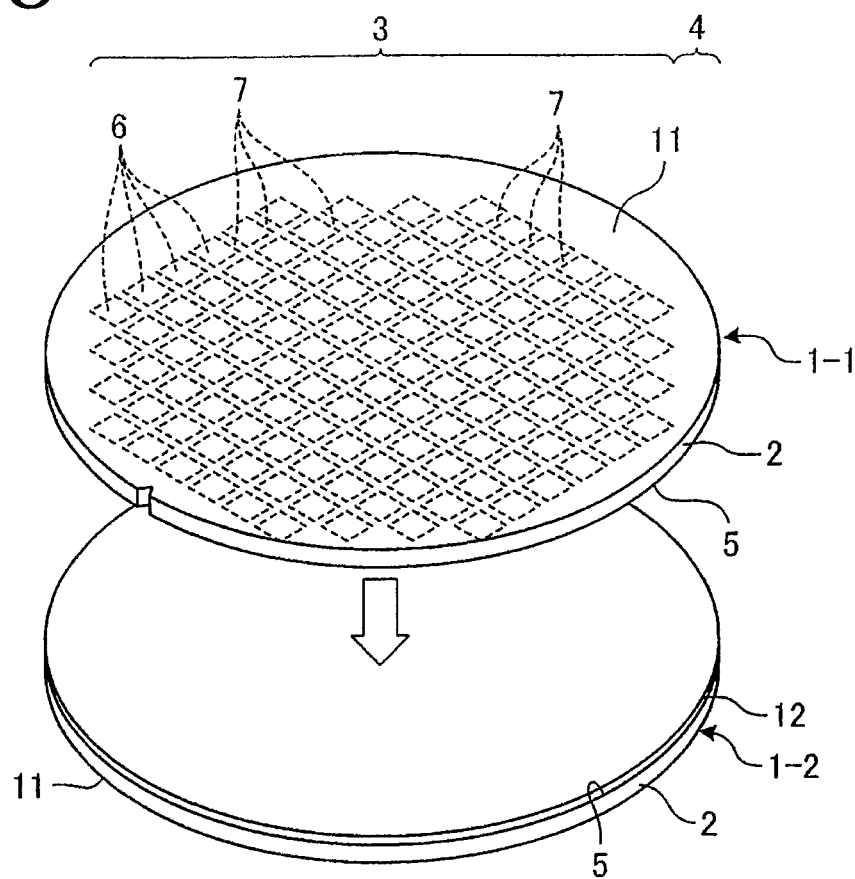
FIG. 5 is a perspective view depicting a state in which a front surface of a first wafer and a front surface of a second wafer are made to face each other, in a bonding step of the wafer processing method depicted in FIG. 4.
Figure 6:
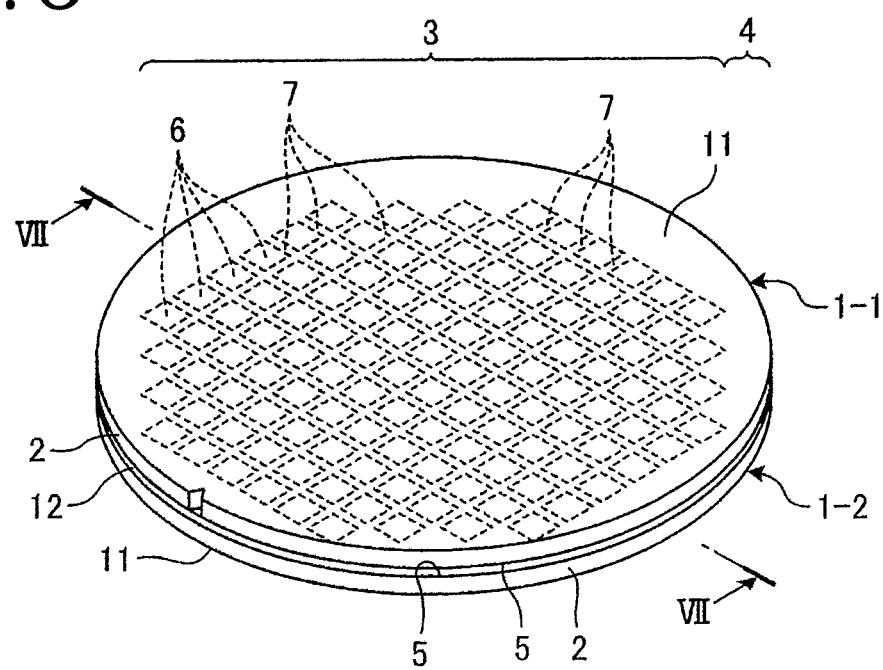
FIG. 6 is a perspective view depicting a state in which the first wafer and the second wafer are bonded to each other, in the bonding step of the wafer processing method depicted in FIG. 4.
Figure 7:
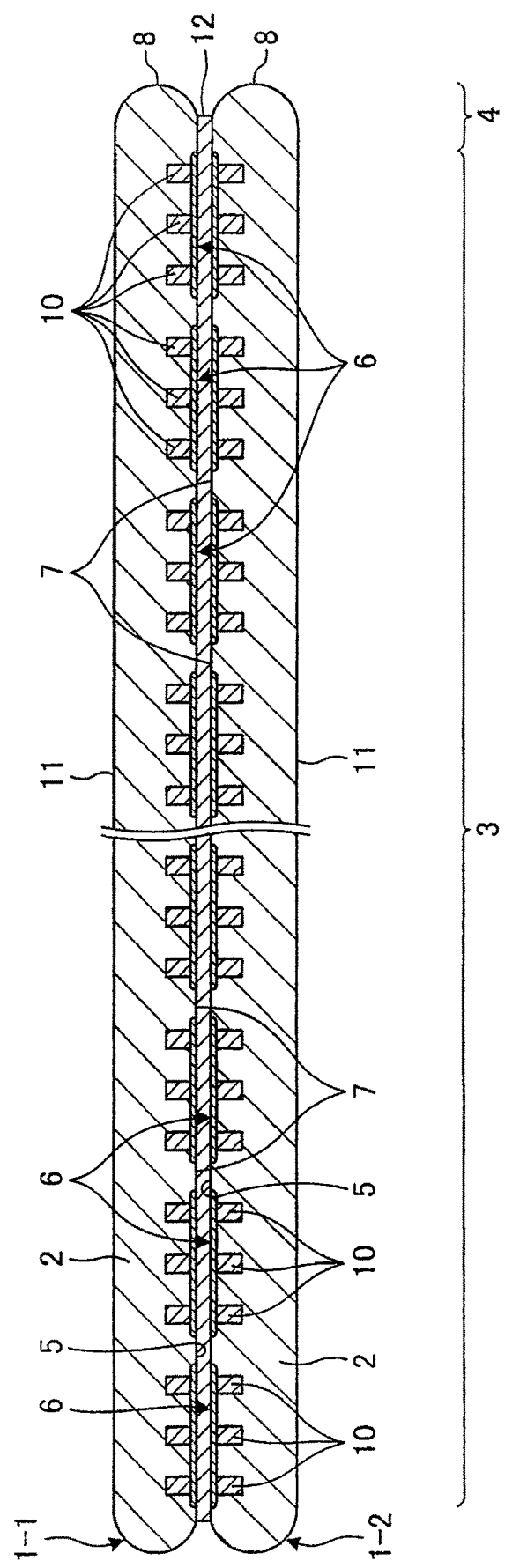
FIG. 7 is a sectional view taken along line VII-VII of FIG. 6.

FIG. 5 is a perspective view depicting a state in which the front surface of the first wafer and the front surface of the second wafer are made to face each other, in the bonding step of the wafer processing method depicted in FIG. 4. FIG. 6 is a perspective view depicting a state in which the first wafer and the second wafer are bonded to each other in the bonding step of the wafer processing method depicted in FIG. 4. FIG. 7 is a sectional view taken along line VII-VII of FIG. 6.

The bonding step ST1 is a step in which the front surface 5 side of the first wafer 1-1 is bonded to the front surface 5 side of the second wafer 1-2. In the bonding step ST1, an adhesive layer 12 is stacked on either one of the front surface 5 of the first wafer 1-1 or the front surface 5 of the second wafer 1-2. In the first embodiment, the adhesive layer 12 is stacked on the front surface 5 of the second wafer 1-2. In the bonding step ST1, the front surface 5 of the first wafer 1-1 and the front surface 5 of the second wafer 1-2 are made to face each other with a gap therebetween, as illustrated in FIG. 5, and then the front surface 5 of the first wafer 1-1 and the front surface 5 of the second wafer 1-2 are bonded to each other, as depicted in FIGS. 6 and 7. Note that in the first embodiment, a double sided tape having adhesive layers stacked on front and back sides of a substrate layer is used as the adhesive layer 12, but in the present invention, the adhesive layer 12 is not limited to a double sided tape. After the front surface 5 of the first wafer 1-1 and the front surface 5 of the second wafer 1-2 are bonded to each other, the wafer processing method proceeds to the modified layer forming step ST2.

(Modified Layer Forming Step)

Figure 8:
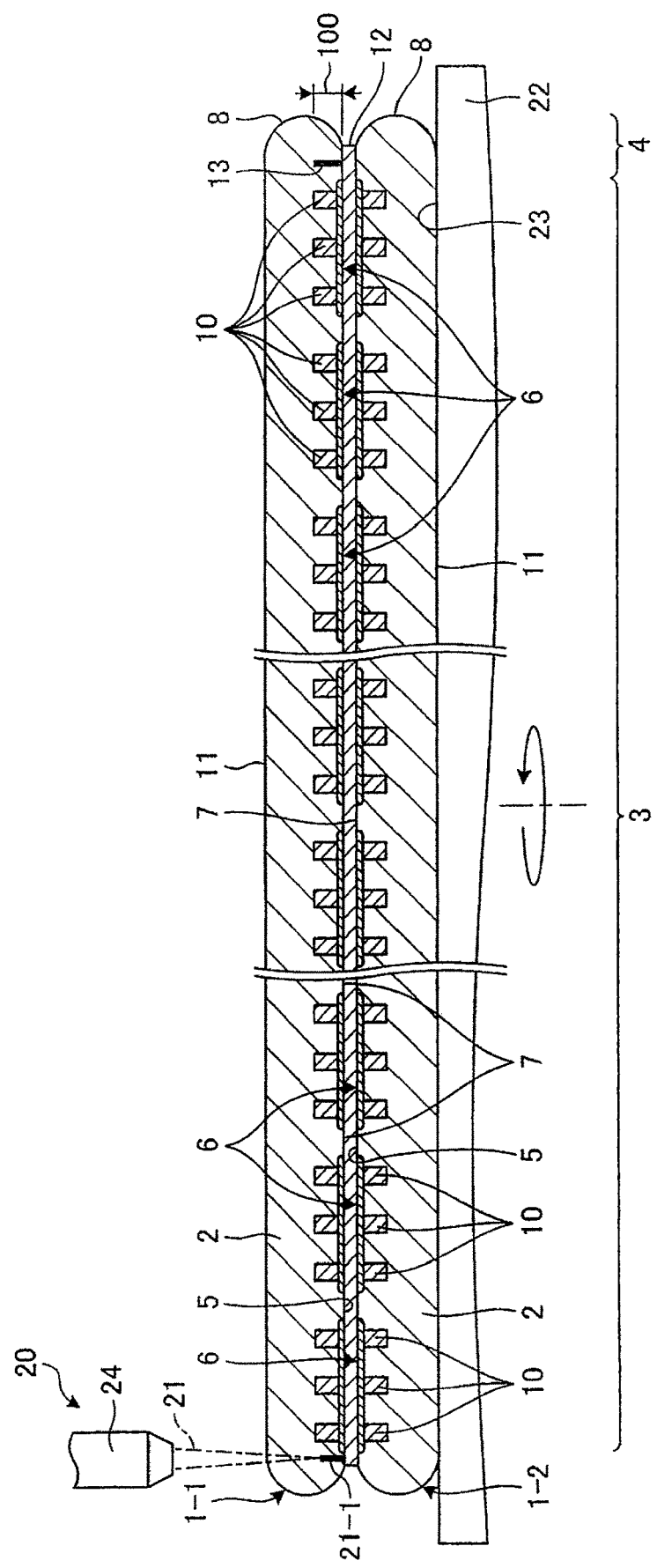
FIG. 8 is a sectional view schematically depicting a modified layer forming step of the wafer processing method depicted in FIG. 4.

FIG. 8 is a sectional view schematically illustrating the modified layer forming step of the wafer processing method depicted in FIG. 4. The modified layer forming step ST2 is a step in which, before the grinding step ST3 but after the bonding step ST1, a laser beam 21 of such a wavelength as to be transmitted trough the first wafer 1-1 is applied along a boundary between the device region 3 and the peripheral surplus region 4 of the first wafer 1-1, to form an annular modified layer 13 inside the first wafer 1-1 in the vicinity of the front surface 5 side of the first wafer 1-1, whereby a crack (depicted in FIG. 10) which is a chipping of the peripheral edge 8 of the first wafer 1-1 generated in the grinding step ST3 is restrained from extending to the device region 3.

Note that the modified layer 13 is a region of which density, refractive index, mechanical strength or other physical property is different from that of the surrounding base material, and is, for example, a melting treatment region, a crack region, a dielectric breakdown region, a refractive index change region, or a region or the like in which these regions are mixedly present. In the first embodiment, the mechanical strength of the modified layer 13 is lower than the mechanical strength of the surroundings.

In the modified layer forming step ST2, a laser processing apparatus 20 holds the back surface 11 side of the second wafer 1-2 under suction on a holding surface 23 of a chuck table 22. In the modified layer forming step ST2, as illustrated in FIG. 8, the laser processing apparatus 20 causes a laser beam applying unit 24 for applying the laser beam 21 to vertically face the first wafer 1-1 at a position on an outer periphery side as compared to the device region 3, thereafter a focal point 21-1 of the laser beam 21 is set to a position which is inside the first wafer 1-1 and is near the front surface 5, and, while the chuck table 22 is being rotated around an axis parallel to the vertical direction, the laser beam 21 is applied from the laser beam applying unit 24 to the first wafer 1-1. Note that in the first embodiment, as illustrated in FIG. 8, the laser processing apparatus 20 causes the laser beam applying unit 24 for applying the laser beam 21 to vertically face the peripheral surplus region 4 of the first wafer 1-1 at a position on or near the boundary between the device region 3 and the peripheral surplus region 4, and the laser beam 21 is applied to the position which is on or near the boundary.

In the modified layer forming step ST2, after the bonding step ST1, the laser processing apparatus 20 forms the annular modified layer 13 inside the first wafer 1-1 on the outer periphery side as compared to the device region 3 continuously along the whole circumference of the first wafer 1-1 by the laser beam 21 applied from the back surface 11 side of the first wafer 1-1. Note that in the modified layer forming step ST2 in the first embodiment, the laser processing apparatus 20 forms the annular continuous modified layer 13 in the range of the finished thickness 100 from the front surface 5 of the first wafer 1-1. In the modified layer forming step ST2, the laser processing apparatus 20 may apply the laser beam 21 in such a condition that a crack is generated to extend in the thickness direction from the modified layer 13. Further, in the modified layer forming step ST2, the laser processing apparatus 20 may apply the laser beam 21 plural times while changing the height of the focal point 21-1 of the laser beam 21, to thereby form a plurality of modified layers 13. In addition, the total thickness of the modified layer 13 and the crack is at least equal to or more than half of the finished thickness 100 of the first wafer 1-1, desirably equal to or more than the finished thickness 100. After the annular continuous modified layer 13 is formed on the outer periphery side as compared to the device region 3 of the first wafer 1-1, the wafer processing method proceeds to the grinding step ST3.

(Grinding Step)

Figure 9:
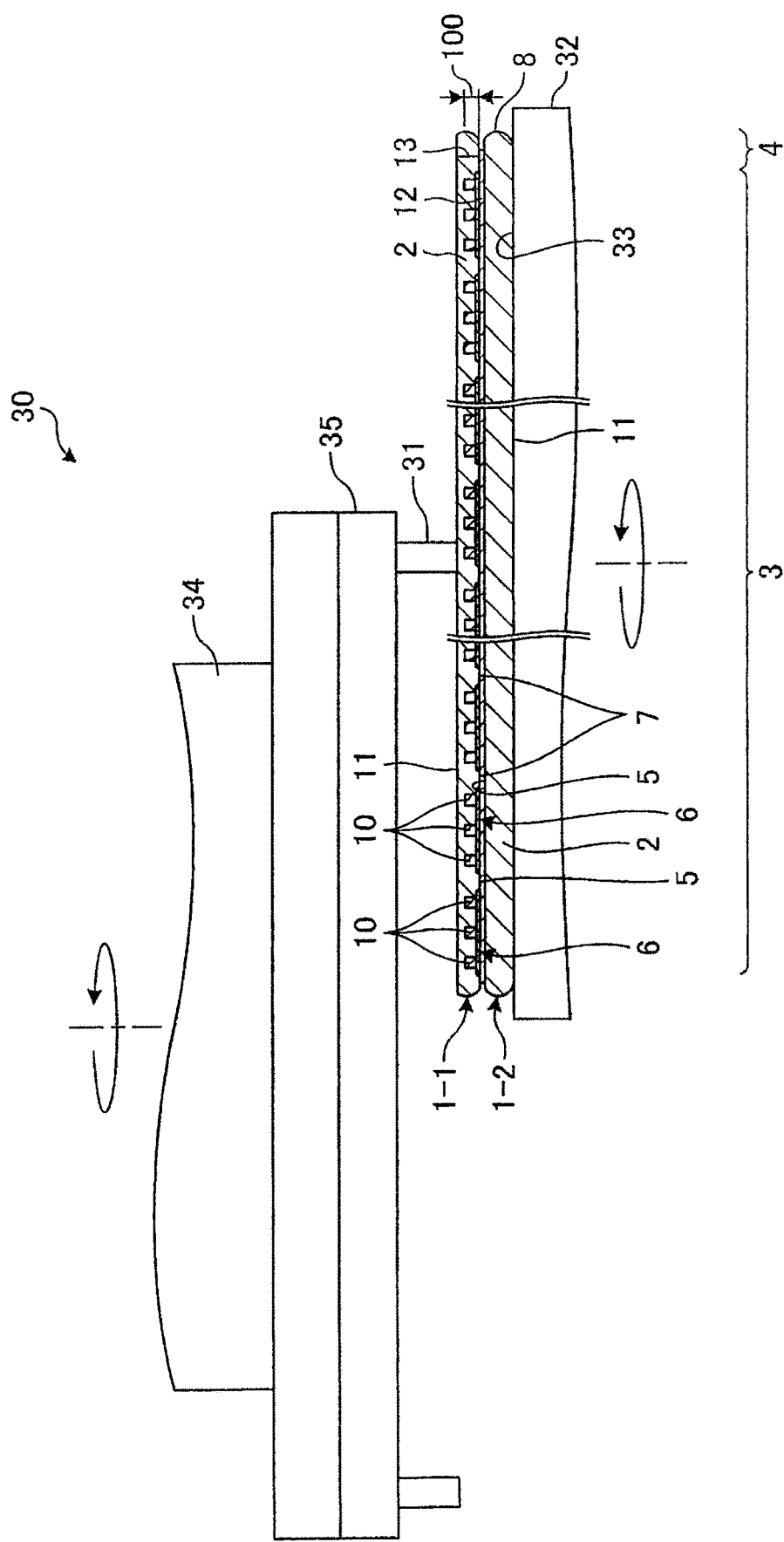
FIG. 9 is a sectional view schematically depicting a grinding step of the wafer processing method depicted in FIG. 4.
Figure 10:
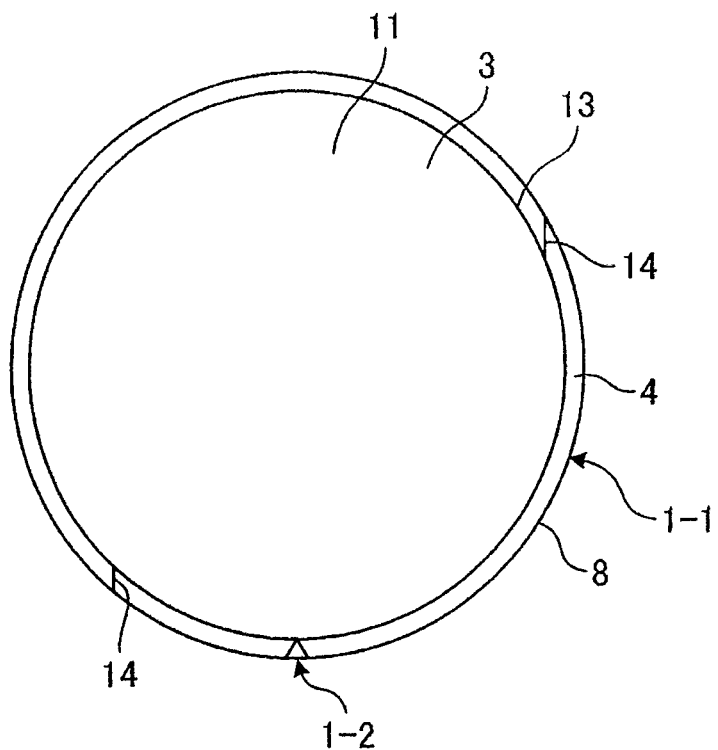
FIG. 10 is a plan view schematically depicting a wafer after the grinding step of the wafer processing method depicted in FIG. 4.

FIG. 9 is a sectional view schematically illustrating the grinding step of the wafer processing method depicted in FIG. 4. FIG. 10 is a plan view schematically illustrating the wafer after the grinding step of the wafer processing method depicted in FIG. 4. The grinding step ST3 is a step in which, after the bonding step ST1, the back surface 11 side of the second wafer 1-2 is held by a chuck table 32 of a grinding apparatus 30, and the back surface 11 side of the first wafer 1-1 is ground to thin the first wafer 1-1 to the finished thickness 100.

In the grinding step ST3, as illustrated in FIG. 9, the grinding apparatus 30 holds under suction the back surface 11 side of the second wafer 1-2 on a holding surface 33 of the chuck table 32, grinding water is supplied while rotating a grinding wheel 35 by a spindle 34 and rotating the chuck table 32 around a rotational axis, and a grindstone 31 of the grinding wheel 35 is brought closer to the chuck table 32 at a predetermined feed speed, whereby the back surface 11 of the first wafer 1-1 is ground by the grindstone 31. In the grinding step ST3, the grinding apparatus 30 grind and thin the first wafer 1-1 to the finished thickness 100. When the grinding apparatus 30 grinds and thins the first wafer 1-1 to the finished thickness 100, in the grinding step ST-3, the other ends of the through-electrodes 10 are exposed to, or put into a state immediately before being exposed to, the back surface 11 side. Note that in FIG. 9 the devices 6 and the through-electrodes 10 of the second wafer 1-2 are omitted, and in FIG. 10 the other ends of the through-electrodes 10 are omitted.

In the grinding step ST3, since the modified layer 13 is formed continuously on the outer periphery side as compared to the device region 3 of the first wafer 1-1, the first wafer 1-1 is ruptured at the modified layer 13. Therefore, when the cracks 14 generated at the peripheral edge 8 of the first wafer 1-1 in the grinding step ST3 extend toward the center of the first wafer 1-1 and reach the modified layer 13 as depicted in FIG. 10, the cracks are restrained from extending toward the center side of the first wafer 1-1 as compared to the modified layer 13, since the first wafer 1-1 is ruptured at the modified layer 13. In addition, the wafer processing method is finished when the first wafer 1-1 has been thinned to the finished thickness 100.

In the wafer processing method according to the first embodiment, the annular modified layer 13 which, even when the cracks 14 are generated at the peripheral edge 8 upon grinding, prevents the cracks 14 from extending into the device region 3 is provided on the outer periphery side as compared to the device region 3 of the wafer 1. Therefore, according to the wafer processing method, even when the cracks 14 are generated at the outer edge of the wafer upon grinding, the cracks are restrained from extending into the device region 3, and grinding of the bonded first wafer 1-1 to an extremely thin state can be realized while restraining breakage of the devices 6. As a result, the wafer processing method has an effect that breakage of the devices 6 during grinding can be restrained.

In addition, the wafer processing method, in which the laser beam 21 is applied to form the modified layer 13 in the modified layer forming step ST2, is free of generation of swarf and is very effective for processing a wafer 1 formed with devices 6 such as image sensors which abhor adhesion of dust onto the devices 6, as compared to the case where the wafer is cut by a cutting blade.

Second Embodiment

Figure 11:
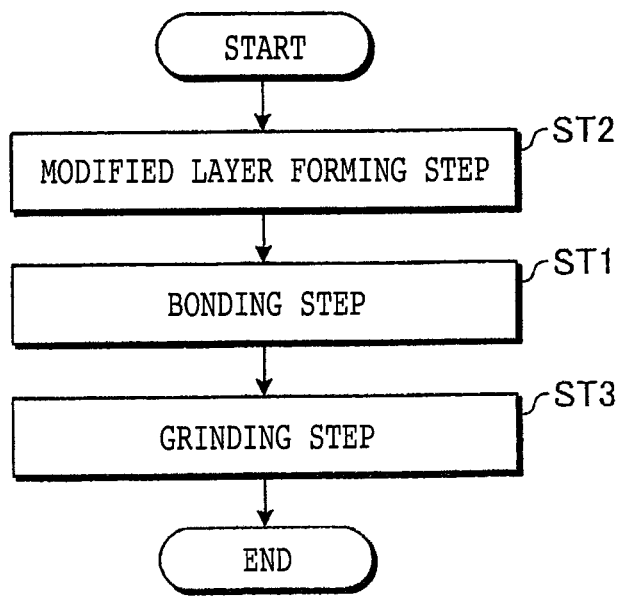
FIG. 11 is a flow chart depicting the flow of a wafer processing method according to a second embodiment.
Figure 12:
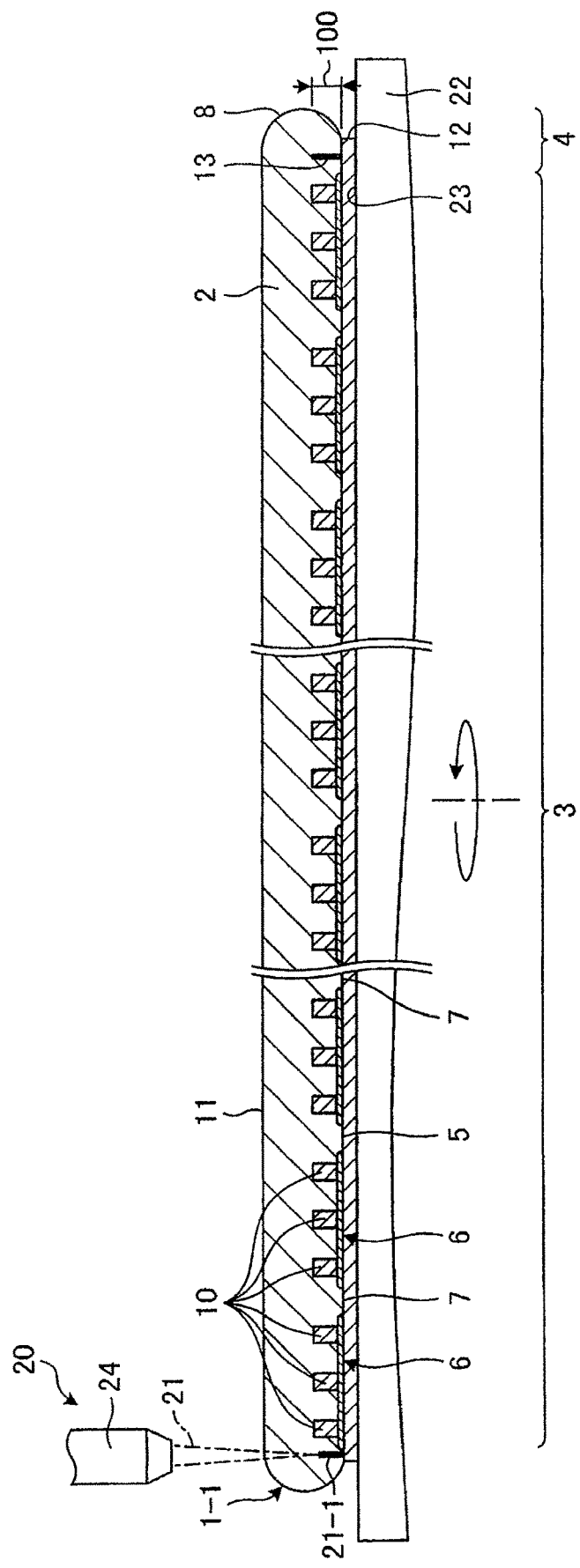
FIG. 12 is a sectional view schematically depicting a modified layer forming step of the wafer processing method depicted in FIG. 11.
Figure 13:
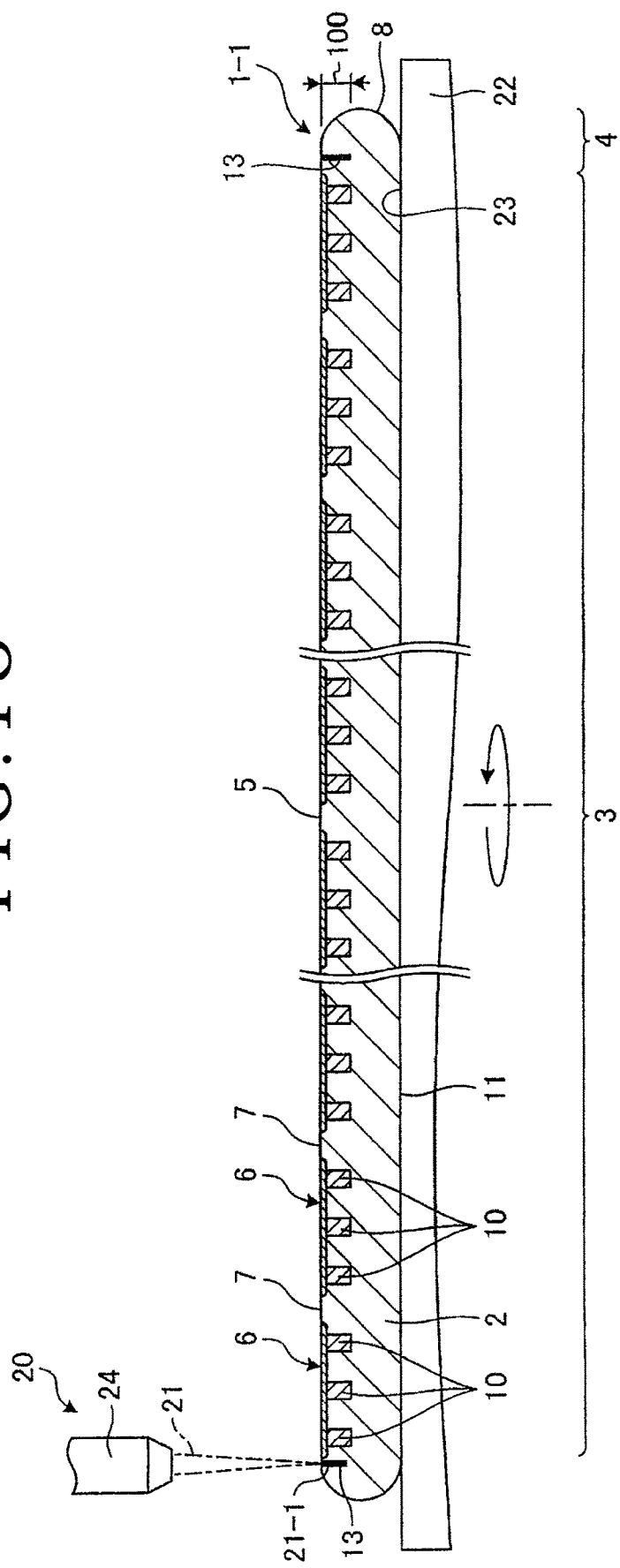
FIG. 13 is a sectional view schematically depicting a modification of the modified layer forming step of the wafer processing method depicted in FIG. 11.

A wafer processing method according to a second embodiment of the present invention will be described based on the drawings. FIG. 11 is a flow chart depicting the flow of the wafer processing method according to the second embodiment. FIG. 12 is a sectional view schematically illustrating a modified layer forming step of the wafer processing method depicted in FIG. 11. FIG. 13 is a sectional view schematically illustrating a modification of the modified layer forming step of the wafer processing method depicted in FIG. 11. In FIGS. 11, 12 and 13, the same parts as those in the first embodiment are denoted by the same reference symbols as used above, and descriptions thereof will be omitted.

The wafer processing method according to the second embodiment is the same as that of the first embodiment, except that the modified layer forming step ST2 is carried out before the bonding step ST1 as depicted in FIG. 11. In the modified layer forming step ST2 of the wafer processing method according to the second embodiment, the laser processing apparatus 20 holds under suction the front surface 5 side of the first wafer 1-1 with the adhesive layer 12 stacked thereon on the holding surface 23 of the chuck table 22. In the modified layer forming step ST2, as illustrated in FIG. 12, similarly to the first embodiment, the laser processing apparatus 20 causes the laser beam applying unit 24 for applying the laser beam 21 to vertically face the first wafer 1-1 at a position on the outer periphery side as compared to the device region 3, thereafter the focal point 21-1 of the laser beam 21 is set to a position which is inside the first wafer 1-1 and is near the front surface 5, and, while rotating the chuck table 22 around an axis parallel to the vertical direction, the laser beam 21 is applied from the laser beam applying unit 24 to the back surface 11 side of the first wafer 1-1. In the modified layer forming step ST2, before the bonding step ST1, the laser processing apparatus 20 forms the annular modified layer 13 inside the first wafer 1-1 on the outer periphery side as compared to the device region 3 continuously along the whole circumference of the latter by the laser beam 21 applied from the back surface 11 side of the first wafer 1-1.

In the wafer processing method according to the second embodiment, the laser beam 21 may be applied in such a condition that cracks are generated to extend in the thickness direction from the modified layer 13. Further, in the wafer processing method according to the second embodiment, the laser beam 21 may be applied plural times while changing the height of the focal point 21-1 of the laser beam 21, to form a plurality of modified layers 13. In addition, the total thickness of the modified layer 13 and the crack is at least equal to or more than half of the finished thickness 100 of the first wafer 1-1, desirably equal to or more than the finished thickness 100. Note that in the modified layer forming step ST2 in the wafer processing method according to the second embodiment, the modified layer 13 has been formed in the first wafer 1-1 with the adhesive layer 12 stacked thereon; however, in the present invention, a protective tape may be adhered to the front surface 5 of the first wafer 1-1, the protective tape side may be held on the chuck table 22, and, after performing laser processing, the front surface 5 of the first wafer 1-1 from which the protective tape has been peeled off may be bonded to the second wafer 1-2.

In addition, in the modified layer forming step ST2 of the wafer processing method according to the second embodiment, as illustrated in FIG. 13, before the bonding step ST1, the laser processing apparatus 20 holds under suction the back surface 11 side of the first wafer 1-1 that is in a state in which the adhesive layer 12 is not stacked, on the holding surface 23 of the chuck table 22, and applies the laser beam 21 from the laser beam applying unit 24 to the front surface 5 side of the first wafer 1-1. In the modified layer forming step ST2 of the wafer processing method according to the second embodiment, the laser processing apparatus 20 may form the annular modified layer 13 inside the first wafer 1-1 on the outer periphery side as compared to the device region 3 continuously along the whole circumference of the first wafer 1-1 by the laser beam 21 applied from the front surface 5 side of the first wafer 1-1, similarly to the first embodiment. After the annular continuous modified layer 13 is formed on the outer periphery side as compared to the device region 3 of the first wafer 1-1, the wafer processing method proceeds to the bonding step ST1.

In the wafer processing method according to the second embodiment, the annular modified layer 13 which, even when cracks 14 are generated at the peripheral edge 8 upon grinding, prevents the cracks 14 from extending into the device region 3 is provided on the outer periphery side as compared to the device region 3 of the wafer 1. As a result, the wafer processing method has an effect that breakage of the devices 6 during grinding can be restrained.

Third Embodiment

Figure 14:
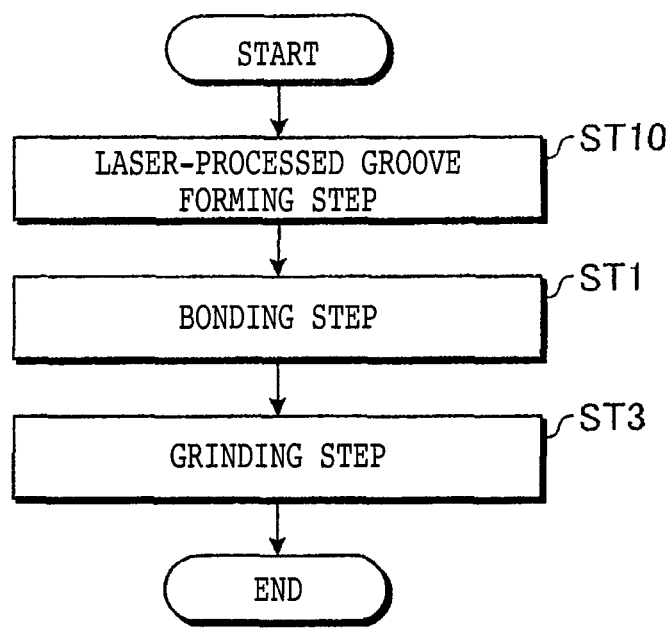
FIG. 14 is a flow chart depicting the flow of a wafer processing method according to a third embodiment.
Figure 15:
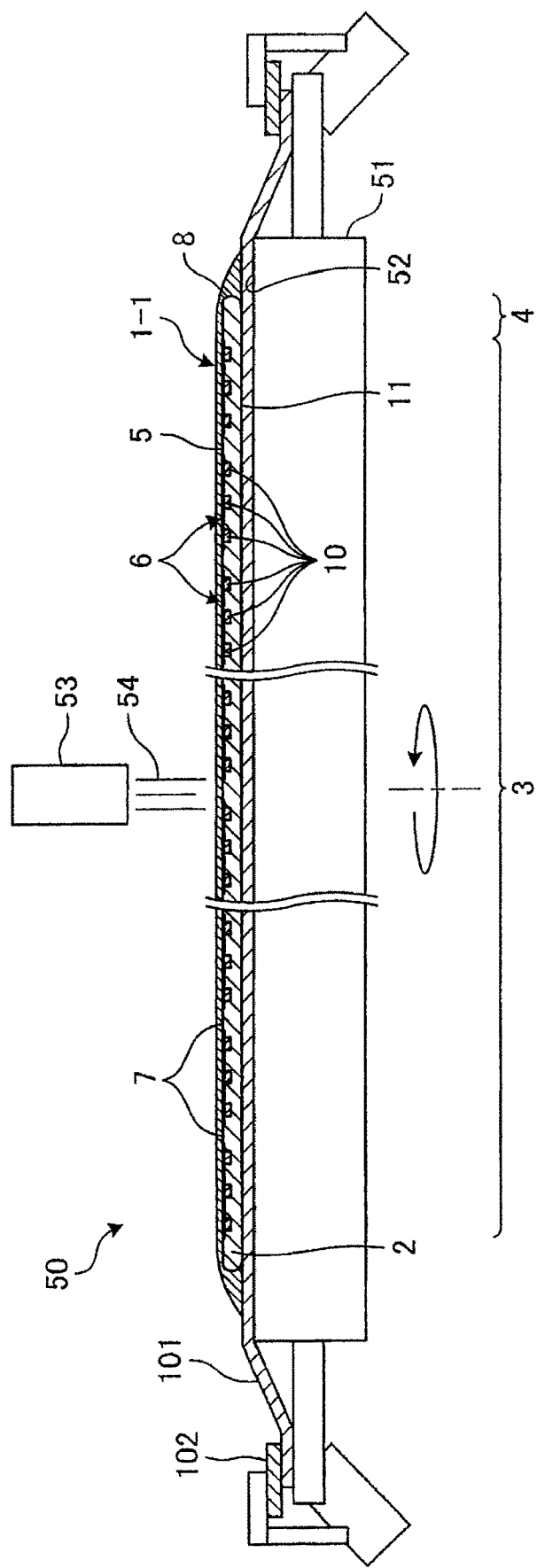
FIG. 15 is a sectional view schematically depicting a state in which a water-soluble resin is applied in a laser-processed groove forming step of the wafer processing method depicted in FIG. 14.
Figure 16:
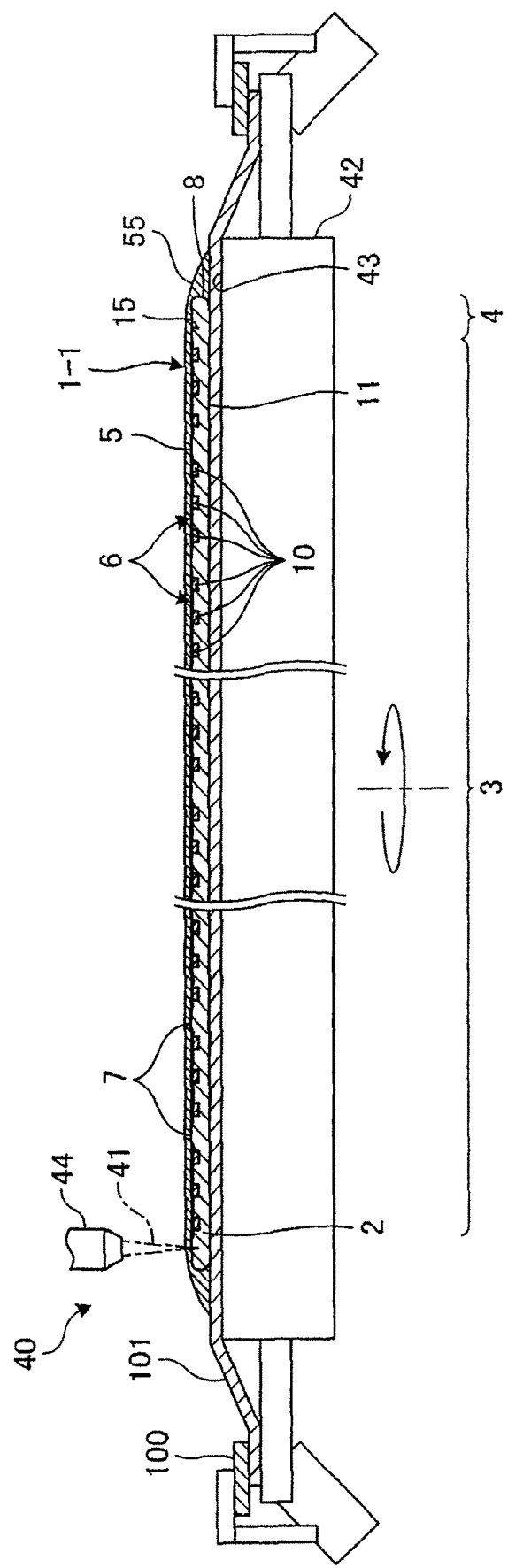
FIG. 16 is a sectional view schematically depicting a state in which a laser-processed groove is formed in the laser-processed groove forming step of the wafer processing method depicted in FIG. 14.
Figure 17:
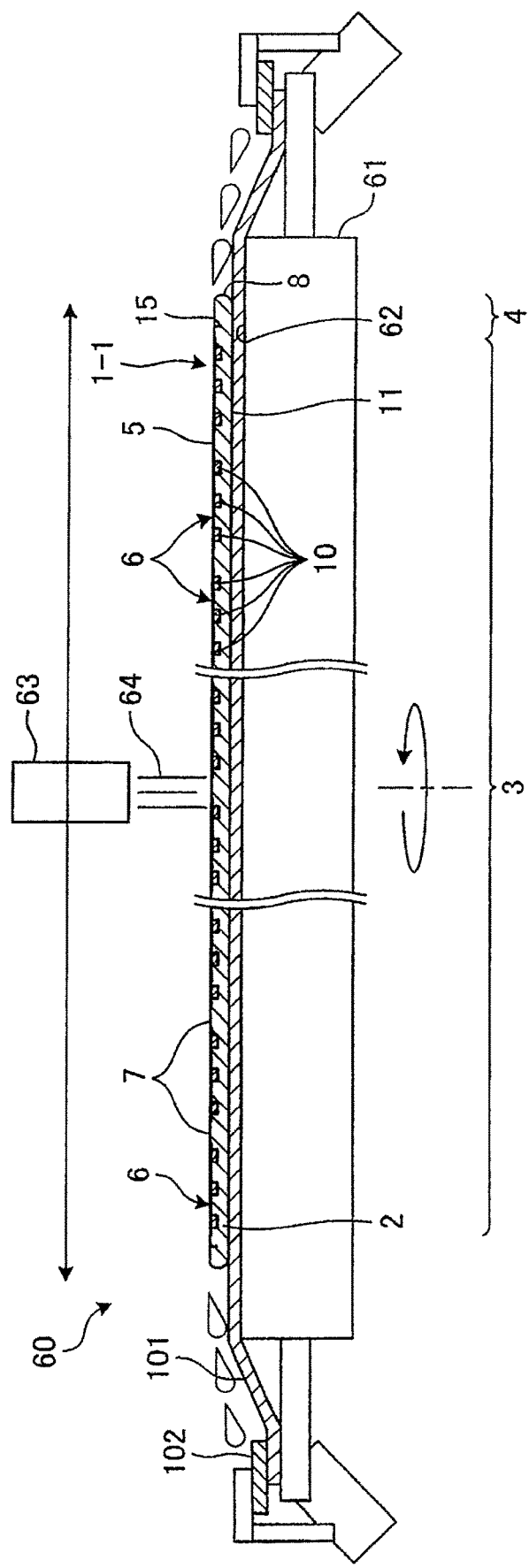
FIG. 17 is a sectional view schematically depicting a state in which the water-soluble resin is removed in the laser-processed groove forming step of the wafer processing method depicted in FIG. 14.

A wafer processing method according to a third embodiment of the present invention will be described based on the drawings. FIG. 14 is a flow chart depicting the flow of the wafer processing method according to the third embodiment. FIG. 15 is a sectional view schematically illustrating a state in which a water-soluble resin is applied in a laser-processed groove forming step of the wafer processing method depicted in FIG. 14. FIG. 16 is a sectional view schematically illustrating a state in which a laser-processed groove is formed in the laser-processed groove forming step of the wafer processing method depicted in FIG. 14. FIG. 17 is a sectional view schematically illustrating a state in which the water-soluble resin is removed in the laser-processed groove forming step of the wafer processing method depicted in FIG. 14. In FIGS. 14, 15, 16, and 17, the same parts as those in the first and second embodiments are denoted by the same reference symbols as used above, and descriptions thereof will be omitted.

The wafer processing method according to the third embodiment is the same as the first and second embodiments, except for including, in place of the modified layer forming step ST2, a laser-processed groove forming step ST10 which is to be carried out before the bonding step ST1, as depicted in FIG. 14.

The laser-processed groove forming step ST10 is a step in which, before the bonding step ST1, a laser beam 41 of such a wavelength as to be absorbed in the first wafer 1-1 is applied from the front surface 5 side of the first wafer 1-1 along the peripheral edge 8 in the device region 3, to form an annular laser-processed groove 15 having a depth exceeding the finished thickness 100 of the first wafer 1-1 on the front surface 5 of the first wafer 1-1.

In the laser-processed groove forming step ST10, an adhesive tape 101 larger in diameter than the first wafer 1-1 is adhered to the back surface 11 of the first wafer 1-1, an annular frame 102 is adhered to a peripheral edge of the adhesive tape 101, then, as depicted in FIG. 15, a resin coating apparatus 50 holds under suction the back surface 11 side of the first wafer 1-1 on a holding surface 52 of a spinner table 51 through the adhesive tape 101, and, while rotating the spinner table 51 around an axis, a liquid water-soluble resin 54 is applied from a coating nozzle 53 on the upper side of the center of the first wafer 1-1 to the front surface 5 side of the first wafer 1-1. The water-soluble resin 54 includes a water-soluble liquid resin such as polyvinyl alcohol (PVA) or polyvinyl pyrrolidone (PVP).

The water-soluble resin 54 applied to the front surface 5 of the first wafer 1-1 is spread to the outer edge side of the first wafer 1-1 by a centrifugal force generated by the rotation of the spinner table 51, to cover the whole part of the front surface 5 of the first wafer 1-1. In the laser-processed groove forming step ST10, the resin coating apparatus 50 applies the water-soluble resin 54 to the front surface 5 side of the first wafer 1-1, after which the water-soluble resin 54 is cured by drying or heating, to cover the whole part of the front surface 5 of the first wafer 1-1 with a water-soluble resin layer 55, as illustrated in FIG. 16.

In the laser-processed groove forming step ST10, the laser processing apparatus 40 holds under suction the back surface 11 side of the second wafer 1-2 on a holding surface 43 of a chuck table 42 through the adhesive tape 101. In the laser-processed groove forming step ST10, as illustrated in FIG. 16, the laser processing apparatus 40 causes a laser beam applying unit 44 for applying a laser beam 41 to vertically face the first wafer 1-1 at a position on the outer periphery side as compared to the device region 3, thereafter the focal point of the laser beam 41 is set to the front surface 5 of the first wafer 1-1, and, while rotating the chuck table 42 around an axis parallel to the vertical direction, the laser beam 41 is applied from the laser beam applying unit 44 to the first wafer 1-1. Note that in the third embodiment, as depicted in FIG. 16, the laser processing apparatus 40 causes the laser beam applying unit 44 for applying the laser beam 41 to vertically face the peripheral surplus region 4 of the first wafer 1-1 at a position on or near a boundary between the device region 3 and the peripheral surplus region 4, and the laser beam 41 is applied to the position on or near the boundary.

In the laser-processed groove forming step ST10, the laser processing apparatus 40 applies ablation processing to the front surface 5 side of the first wafer 1-1 on the outer periphery side as compared to the device region 3 along the whole circumference, to form continuously along the whole circumference an annular laser-processed groove 15 on the front surface 5 side of the first wafer 1-1 on the outer periphery side as compared to the device region 3. Note that in the third embodiment, in the laser-processed groove forming step ST10, the laser processing apparatus 40 forms the annular continuous laser-processed groove 15 having a depth exceeding the finished thickness 100 from the front surface 5 of the first wafer 1-1.

In the laser-processed groove forming step ST10, after the laser-processed groove 15 is formed, as depicted in FIG. 17, a cleaning apparatus 60 holds under suction the back surface 11 side of the first wafer 1-1 on a holding surface 62 of a spinner table 61 through the adhesive tape 101, the spinner table 61 is rotated around an axis, and cleaning water 64 is jetted toward the front surface 5 of the first wafer 1-1 from a cleaning water nozzle 63 moved over the first wafer 1-1 along the holding surface 62. In the laser-processed groove forming step ST10, the cleaning water 64 flows smoothly on the front surface 5 of the first wafer 1-1 by a centrifugal force generated by the rotation of the spinner table 61, to wash away debris adhered to the water-soluble resin layer 55 together with the resin layer 55 and remove them from the front surface 5 of the first wafer 1-1. In the laser-processed groove forming step ST10, after the cleaning apparatus 60 supplies the cleaning water 64 to the front surface 5 of the first wafer 1-1 while rotating the spinner table 61 for a predetermined period of time, the cleaning of the first wafer 1-1 is finished, and the first water 1-1 is dried.

Note that in the third embodiment, the resin coating apparatus 50 forms the water-soluble resin layer 55, and the cleaning apparatus 60 different from the resin coating apparatus 50 cleans the front surface 5 of the first wafer 1-1, but, in the present invention, one apparatus having both the nozzles 53 and 63 may form the wafer-soluble resin layer 55 and clean the front surface 5 of the first wafer 1-1. After the front surface 5 of the first wafer 1-1 is cleaned by the cleaning water 64 and the first wafer 1-1 is dried, the wafer processing method proceeds to the bonding step ST1.

In the wafer processing method according to the third embodiment, the annular laser-processed groove 15 which, even when cracks 14 are generated at the peripheral edge 8 upon grinding, prevents the cracks 14 from extending into the device region 3 is provided on the outer periphery side as compared to the device region 3 of the wafer 1. As a result, the wafer processing method has an effect that breakage of the devices 6 during grinding can be restrained.

Fourth Embodiment

Figure 18:
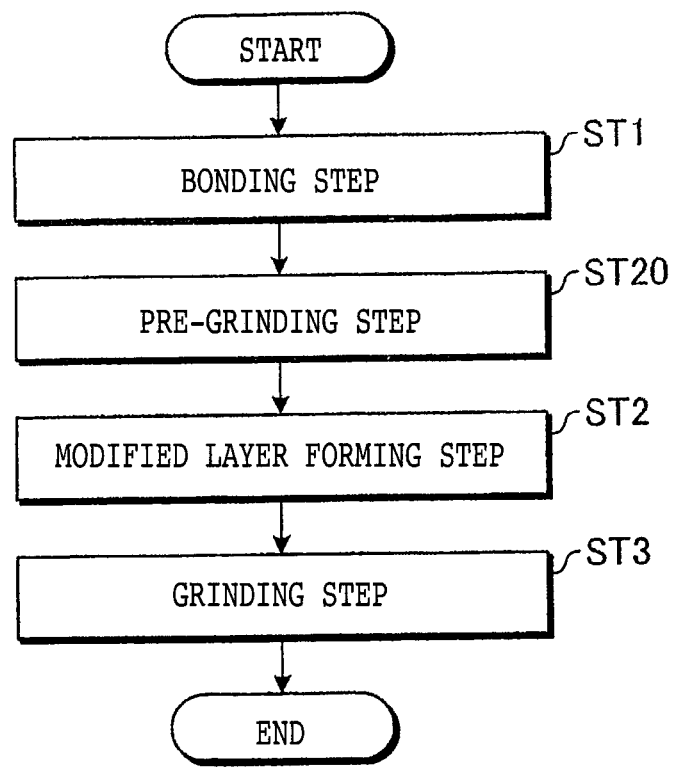
FIG. 18 is a flow chart depicting the flow of a wafer processing method according to a fourth embodiment.
Figure 19:
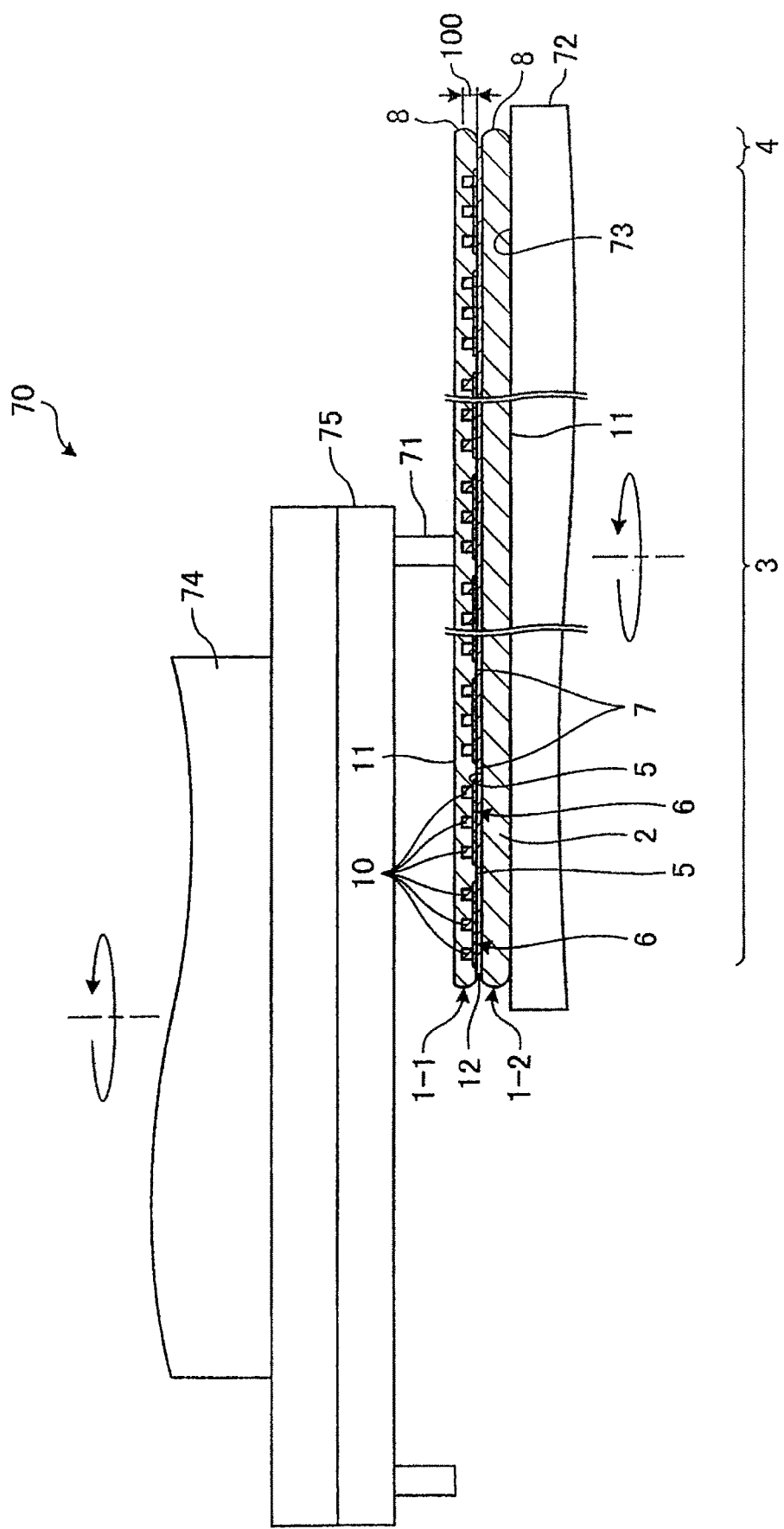
FIG. 19 is a sectional view schematically depicting a pre-grinding step of the wafer processing method depicted in FIG. 18.
Figure 20:
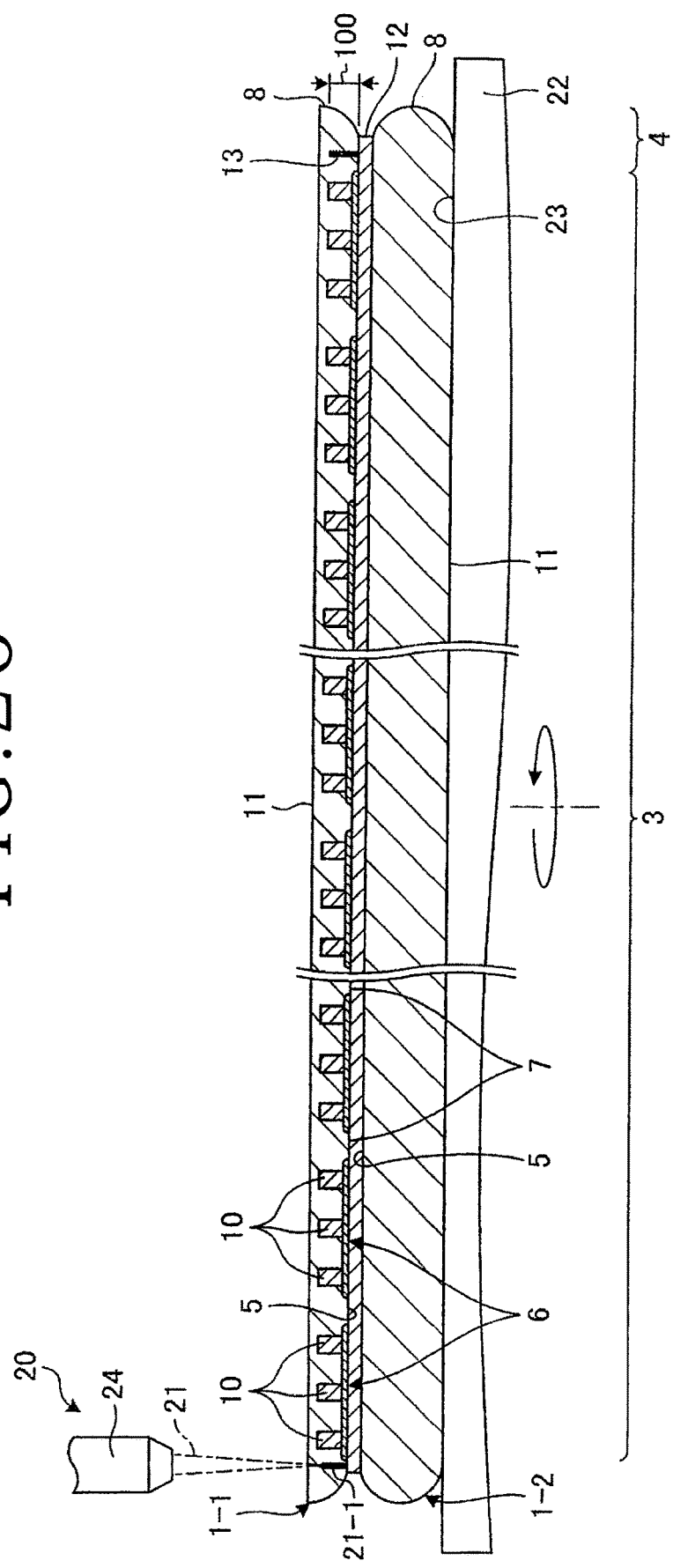
FIG. 20 is a sectional view schematically depicting a modified layer forming step of the wafer processing method depicted in FIG. 18.

A wafer processing method according to a fourth embodiment of the present invention will be described based on the drawings. FIG. 18 is a flow chart depicting the flow of the wafer processing method according to the fourth embodiment. FIG. 19 is a sectional view schematically illustrating a pre-grinding step of the wafer processing method depicted in FIG. 18. FIG. 20 is a sectional view schematically illustrating a modified layer forming step of the wafer processing method depicted in FIG. 18. In FIGS. 18, 19, and 20, the same parts as those in the first, second and third embodiments are denoted by the same reference symbols as used above, and descriptions thereof will be omitted.

The wafer processing method according to the fourth embodiment is the same as that of the first embodiment, except for including a pre-grinding step ST20 as depicted in FIG. 18. In the fourth embodiment, the pre-grinding step ST20 is a step of preliminarily grinding the back surface 11 of the first wafer 1-1, after the bonding step ST1 but before the modified layer forming step ST2.

In the pre-grinding step ST20, a grinding apparatus 70 holds under suction the back surface 11 side of the second wafer 1-2 on a holding surface 73 of a chuck table 72, grinding water is supplied while rotating a grinding wheel 75 by a spindle 74 and rotating the chuck table 72 around an axis, as illustrated in FIG. 19, and a grindstone 71 of the grinding wheel 75 is brought closer to the chuck table 72 at a predetermined feed speed, whereby the back surface 11 of the first wafer 1-1 is ground by the grindstone 71.

In the pre-grinding step ST20, the first wafer 1-1 is ground until it reaches a predetermined thickness thicker than the finished thickness 100. After the first wafer 1-1 is thinned to the predetermined thickness, the wafer processing method proceeds to the modified layer forming step ST2.

In the modified layer forming step ST2 of the wafer processing method according to the fourth embodiment, as illustrated in FIG. 20, the laser beam 21 is applied to the back surface 11 of the first wafer 1-1 ground in the pre-grinding step ST20, to form the modified layer 13. Note that in FIGS. 19 and 20, the devices 6 and the through-electrodes 10 of the second wafer 1-2 are omitted.

In the wafer processing method according to the fourth embodiment, the annular modified layer 13 which, even when cracks 14 are generated at the peripheral edge 8 upon grinding, prevents the cracks 14 from extending into the device region 3 is provided on the outer periphery side as compared to the device region 3 of the first wafer 1-1. As a result, the wafer processing method has an effect that breakage of the devices 6 during grinding can be restrained.

In addition, in the wafer processing method according to the fourth embodiment, since the first wafer 1-1 is thinned in the pre-grinding step ST20, the modified layer 13 can be formed at a desired position even if the laser beam 21 is applied from the back surface 11 side in the modified layer forming step ST2. In the wafer processing method according to the fourth embodiment, since the method includes the pre-grinding step ST20, it is ensured in the modified layer forming step ST2 that, the distance between a focusing lens of the laser beam applying unit 24 and the focal point 21-1 is short, and the distance by which the laser beam 21 is transmitted through the wafer 1 is also short, so that an effect can be produced such that the laser beam 21 can be sufficiently focused on the focal point 21-1, without the need to use a focusing lens with a high numerical aperture.

Note that in the fourth embodiment, the modified layer forming step ST2 has been carried out after the pre-grinding step ST20, but, in the present invention, the modified layer forming step ST2 may be performed before the bonding step ST1. In addition, in the fourth embodiment, the modified layer forming step ST2 has been carried out after the pre-grinding step ST20, but, in the present invention, the laser-processed groove forming step ST10 may be carried out, in place of the modified layer forming step ST2, before the bonding step ST1.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method comprising:
   a bonding step of bonding a front surface side of a first wafer chamfered at a peripheral edge portion thereof to a front surface side of a second wafer, the first wafer having on the front surface thereof a device region formed with a plurality of devices and a peripheral surplus region surrounding the device region;
   after the bonding step, a modified layer forming step of applying along a boundary between the device region and the peripheral surplus region of the first wafer a laser beam of such a wavelength as to be transmitted through the first wafer, to form an annular modified layer inside the first wafer in a vicinity of the front surface, before a grinding step is performed, wherein the modified layer is formed by the laser beam applied from the back surface side of the first wafer after the bonding step and wherein the modified layer does not extend to the back surface of the first wafer;
   after the modified layer forming step, the grinding step of holding a back surface side of the second wafer by a chuck table and grinding a back surface of the first wafer to thin the first wafer to a finished thickness;
   wherein chipping of the peripheral edge portion of the first wafer generated in the grinding step is restrained from extending into the device region by the annular modified layer.

2. The wafer processing method according to claim 1, wherein
   in the modified layer forming step, the laser beam is applied a plurality of times while changing a height of a focal point of the laser beam, to thereby form a plurality of modified layers in the vicinity of the front surface.

3. The wafer processing method according to claim 1, wherein the total thickness of the modified layer and any associated crack is at least equal to or more than half of a finished thickness of the first wafer.

4. The wafer processing method according to claim 1, wherein the total thickness of the modified layer and any associated crack is equal to or more than a finished thickness of the first wafer.

5. The wafer processing method according to claim 1, wherein the plurality of devices are image sensors and wherein the modified layer is formed free of the generation of swarf.

6. The wafer processing method according to claim 1, wherein
   in the modified layer forming step, the focal point of the laser beam is set to a position which is inside the first wafer and is near the front surface of the first wafer, and, while the chuck table is being rotated, the laser beam is applied to the first wafer.

7. The wafer processing method according to claim 6, wherein the annular continuous modified layer is formed only in the range of a finished thickness from the front surface of the first wafer.

8. The wafer processing method according to claim 1, further comprising a pre-grinding step performed after the bonding step and before the modified layer forming step, the pre-grinding step comprising holding a back surface side of the second wafer by a chuck table and grinding a back surface of the first wafer to thin the first wafer to a predetermined thickness greater than the finished thickness.

9. The wafer processing method according to claim 8, wherein modified layer is formed by the laser beam without the use of a focusing lens with a high numerical aperture.

10. A wafer processing method, wherein a first wafer is chamfered at a peripheral edge portion and has on a front surface thereof a device region formed with a plurality of devices and a peripheral surplus region surrounding the device region, the method comprising:
   a modified layer forming step of applying along a boundary between the device region and the peripheral surplus region of the first wafer a laser beam of such a wavelength as to be transmitted through the first wafer, to form an annular modified layer inside the first wafer in a vicinity of the front surface, wherein the modified layer is formed by the laser beam applied from the back surface side of the first wafer and wherein the modified layer does not extend to the back surface of the first wafer;

after the modified layer forming step, a bonding step of bonding the front surface side of the first wafer to a front surface side of a second wafer; and after the bonding step is performed, a grinding step of holding a back surface side of the second wafer by a chuck table and grinding a back surface of the first wafer to thin the first wafer to a finished thickness;

wherein chipping of the peripheral edge portion of the first wafer generated in the grinding step is restrained from extending into the device region by the annular modified layer.

\* \* \* \* \*